(12) United States Patent
Nam et al.

(10) Patent No.: US 9,595,642 B2
(45) Date of Patent: Mar. 14, 2017

(54) CHIP SUBSTRATE COMPRISING A PLATED LAYER AND CHIP PACKAGE USING THE SAME

(71) Applicant: POINT ENGINEERING CO., LTD., Asan-si (KR)

(72) Inventors: Ki Myung Nam, Cheonan-si (KR); Young Woon Jeon, Ansan-si (KR); Kyoung Ja Yun, Cheonan-si (KR)

(73) Assignee: Point Engineering Co., Ltd., Asan-si, Chungcheongnam-do (KR)

( * ) Notice: Subject to any disclaimer, the term of this patent is extended or adjusted under 35 U.S.C. 154(b) by 0 days.

(21) Appl. No.: 14/753,869

(22) Filed: Jun. 29, 2015

(65) Prior Publication Data

US 2016/0380159 A1 Dec. 29, 2016

(51) Int. Cl.
| | |
|---|---|
| *H01L 33/36* | (2010.01) |
| *H01L 33/50* | (2010.01) |
| *H01L 33/48* | (2010.01) |
| *H01L 33/52* | (2010.01) |
| *H01L 33/58* | (2010.01) |

(Continued)

(52) U.S. Cl.
CPC ............ *H01L 33/483* (2013.01); *H01L 33/54* (2013.01); *H01L 33/58* (2013.01); *H01L 33/62* (2013.01)

(58) Field of Classification Search
CPC ....... H01L 33/483; H01L 33/54; H01L 33/58; H01L 33/62; H01L 33/36; H01L 33/50; H01L 33/48; H01L 33/52
USPC ............. 257/99, 98, 758; 174/255; 438/622; 362/294
See application file for complete search history.

(56) References Cited

U.S. PATENT DOCUMENTS

| 8,746,932 B2 | 6/2014 | Ide et al. ...................... 362/297 |
| 9,000,593 B2 | 4/2015 | Suh et al. ......... H01L 23/49562 |

(Continued)

FOREIGN PATENT DOCUMENTS

| JP | 2006-179520 | 7/2006 | ............ C09K 11/08 |
| KR | 10-2011-0055401 | 5/2011 | ............ H01L 33/48 |

(Continued)

OTHER PUBLICATIONS

Korean Intellectual Property Office, Office Action—Notification of Grounds for Rejection for Application No. 10-2014-0070723, dated May 18, 2015, 5 pages.

(Continued)

*Primary Examiner* — Cuong Q Nguyen
*Assistant Examiner* — Tong-Ho Kim
(74) *Attorney, Agent, or Firm* — Sunstein Kann Murphy & Timbers LLP

(57) ABSTRACT

A chip substrate includes laminated conductive portions, and laminated insulation portions that electrically isolate the conductive portions, with a cavity in a recessed shape in a region including the insulation portions on an upper surface of the chip substrate. The substrate includes an insulation layer on the upper surface, excluding a region of the cavity, and a continuous plating layer along a periphery of the chip substrate on the insulation layer. A portion of a top surface of each insulation portion is exposed in the cavity, and another portion of the top surface of each insulation portion is coated with the insulation layer. A chip package includes a chip substrate, with an optical element sealed in the cavity by a sealing member or lens.

9 Claims, 2 Drawing Sheets

(51) Int. Cl.
*H01L 33/54* (2010.01)
*H01L 33/62* (2010.01)

(56) References Cited

U.S. PATENT DOCUMENTS

| | | | | |
|---|---|---|---|---|
| 2007/0145400 A1* | 6/2007 | Sunohara | ............. | H01L 33/483 |
| | | | | 257/98 |
| 2011/0116271 A1* | 5/2011 | Ide | ........................ | H01L 33/486 |
| | | | | 362/294 |
| 2012/0091493 A1* | 4/2012 | Lin | ........................ | H05K 1/021 |
| | | | | 257/98 |
| 2013/0037955 A1* | 2/2013 | Suh | ........................ | H01L 23/142 |
| | | | | 257/758 |

FOREIGN PATENT DOCUMENTS

| | | | | |
|---|---|---|---|---|
| KR | 1020110109651 | * | 10/2011 | |
| KR | 10-2013-0016502 | | 2/2013 | ............. H01L 33/48 |
| KR | 10-2013-0103135 | | 9/2013 | ............. H01L 33/36 |
| KR | 1020130103135 | * | 9/2013 | |

OTHER PUBLICATIONS

Korean Intellectual Property Office, Office Action—Notification of Grounds for Rejection for Application No. 10-2014-0070723, dated May 18, 2015, 4 pages (English translation).

* cited by examiner

CHIP SUBSTRATE COMPRISING A PLATED LAYER AND CHIP PACKAGE USING THE SAME

BACKGROUND

1. Technical Field

The present invention relates to a chip substrate and, more particularly, to a configuration for sealing a chip substrate in which an optical element is mounted.

2. Description of Related Art

In the related art, spaces for mounting chips to an uncut chip plate are formed on the upper surface of the uncut chip plate by mechanical processing or chemical etching. That is to say, Korean Patent No. 10-0986211 discloses a method in which mounting spaces are formed by etching an upper portion of an unprocessed rectangular uncut metal plate.

In the case where optical element chips such as UV LEDs or the like are mounted on such an uncut chip plate, spaces having a wide-top/narrow-bottom shape are formed in the uncut chip plate in order to enhance the light reflection performance. After forming the spaces, chips are mounted within the spaces. The spaces are sealed by lenses in order to enhance the light efficiency.

Since the spaces for mounting the chips are formed in a circular shape when seen from above the uncut chip plate, the lens is also formed in a circular shape so as to correspond to the shape of the spaces.

However, as compared with a case where a lens having an angular shape such as a rectangular shape or a triangular shape is processed, it is difficult in a manufacturing process to accurately process a lens in a circular shape.

SUMMARY

In view of the above technical problem, it is an object of the present invention to provide a configuration capable of manufacturing a chip package by forming an insulation layer and a plating layer on an upper surface of a chip substrate and bonding a sealing member, which has a plating layer corresponding to the plating layer of the chip substrate, to the chip substrate.

In accordance with one aspect of the present invention, there is provided a chip substrate, including: conductive portions laminated in one direction to constitute the chip substrate; an insulation portions alternately laminated with the conductive portions to electrically isolate the conductive portions; a cavity formed at a predetermined depth in a recessed shape in a region including the insulation portions on an upper surface of the chip substrate; an insulation layer coated on an upper surface of the chip substrate excluding a region of the cavity; and a plating layer continuously formed at a predetermined width along a periphery of the chip substrate on the insulation layer.

The chip substrate may further include: a bump formed at a predetermined height within the cavity on a surface of at least one of the conductive portions isolated by the insulation portion.

The chip substrate may further include: a bump formed at a predetermined height within the cavity on surfaces of the conductive portions across the insulation portion.

The conductive portions or the insulation portions may be formed in a plural number and the cavity may be formed in a recessed shape in a region including at least two or more of the conductive portions and at least one or more of the insulation portion.

The chip substrate may further include: an insulation protection layer coated on at least a portion of a lower surface or a side surface of the chip substrate including the insulation portion.

The insulation portions may be bonded to each of the conductive portions through an anodizing layer formed on at least one surface of each of the conductive portions and may be configured to electrically isolate the conductive portions.

In accordance with another aspect of the present invention, there is provided a chip substrate sealing member, including: a sealing portion disposed on an upper surface of a chip substrate which includes conductive portions laminated in one direction and insulation portions alternately laminated with the conductive portions to electrically isolate the conductive portions, the sealing portion configured to seal a cavity formed at a predetermined depth in a recessed shape in a region including the insulation portion; and a counterpart plating layer formed on one surface of the sealing portion in a corresponding relationship with a plating layer continuously formed at a predetermined width along a periphery of the chip substrate on an insulation layer coated on the upper surface of the chip substrate excluding a region of the cavity.

The counterpart plating layer may be formed on a surface of the sealing portion to be bonded to the chip substrate.

In accordance with a further aspect of the present invention, there is provided a chip package, including: a chip substrate which includes conductive portions laminated in one direction to constitute the chip substrate, an insulation portions alternately laminated with the conductive portions to electrically isolate the conductive portions, a cavity formed at a predetermined depth in a recessed shape in a region including the insulation portion, an insulation layer coated on an upper surface of the chip substrate excluding a region of the cavity, and a plating layer continuously formed at a predetermined width along a periphery of the chip substrate on the insulation layer; an optical element mounted within the cavity; and a sealing member including a sealing portion configured to seal the cavity and a counterpart plating layer formed on one surface of the sealing portion in a corresponding relationship with the plating layer of the chip substrate, the sealing member configured to seal the cavity when the counterpart plating layer is bonded to the plating layer of the chip substrate.

According to the present invention, when sealing a cavity formed in a chip substrate, there is no need to mold and process a lens in a circular shape corresponding to the shape of the cavity. This makes it possible to seal the chip substrate with a lens having a simple shape such as a rectangular shape or the like. It is therefore possible to simplify a manufacturing process of a chip package.

DETAILED DESCRIPTION OF THE PREFERRED EMBODIMENTS

The following disclosure merely illustrates the principle of the invention. While not explicitly described or illustrated in the subject specification, it may be possible to invent different devices which realize the principle of the invention and which fall within the conception and scope of the invention. Furthermore, all the conditional terms and embodiments disclosed herein are essentially intended to facilitate understanding of the concept of the invention. It is to be understood that the embodiments and states specifically described herein are not limitative.

The above objects, features and advantages will become more apparent from the following detailed descriptions given in conjunction with the accompanying drawings. Thus, a person having an ordinary knowledge in the technical field to which the invention pertains will be able to easily carry out the technical concept of the invention.

In describing the invention, if it is determined that the detailed descriptions on the prior art related to the invention may unnecessarily make obscure the spirit of the invention, the descriptions will be omitted. Hereinafter, the present invention will be described in detail with reference to the accompanying drawings.

Figure 1:
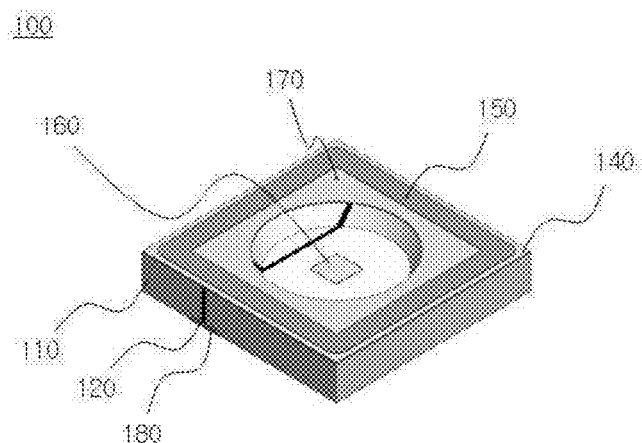
FIG. 1 is a perspective view illustrating a chip substrate including a plating layer according to one embodiment of the present invention.

FIG. 1 is a perspective view illustrating a chip substrate including a plating layer according to one embodiment of the present invention. Referring to FIG. 1, the chip substrate 100 according to the present embodiment includes conductive portions 110, insulation portions 120, a cavity 130, an insulation layer 140 and a plating layer 150.

In the present embodiment, voltages are applied to a chip mounted to the conductive portions 110. That is to say, the conductive portions 110 are made of an electrically conductive material in order to apply voltages to the chip. The lower portions of the conductive portions 110 are bonded to a printed circuit board or the like in which electrodes are formed. Thus, the conductive portions 110 are applied with voltages from the outside. In the present embodiment, the conductive portions 110 may be formed by an aluminum plate.

The insulation portions 120 electrically isolate the conductive portions 110 in order to apply voltages to the respective electrode portions of the chip. That is to say, the insulation portions 120 electrically isolate the conductive portions 110 in order to apply voltages, i.e., a positive voltage and a negative voltage, to the chip. The respective conductive portions 110 thus isolated may be applied with a positive voltage and a negative voltage from the outside.

Furthermore, in the present embodiment, the conductive portions 110 may be formed in a plural number in order to apply voltages to at least two chips. That is to say, referring to FIG. 1, three conductive portions 110 may be bonded in one unit substrate 100.

Moreover, in the present embodiment, the insulation portions 120 may be formed in a plural number in order to isolate the conductive portions 110 to apply different voltages to at least one or more chips. That is to say, referring to FIG. 1, in one unit substrate 100, two insulation portions 120 may be formed between three conductive portions 110.

In the present embodiment, each of the insulation portions 120 may be formed of an insulation film made of a synthetic resin. In this case, the conductive portions 110 and the insulation portions 120 are bonded using a liquid adhesive agent or the like. In order to increase the bonding force, the bonding may be performed by interposing a synthetic-resin-made bonding film between the conductive portions 110. In order to further increase the bonding force, the bonding process may be performed within a high-temperature/high-pressure chamber capable of maintaining a temperature higher than a room temperature and a pressure higher than an atmospheric pressure. In addition, the boding process may be performed after the bonding surfaces are roughened by a mechanical or chemical method.

That is to say, in the present embodiment, at least one surface of the conductive portions 110, preferably the surface of each of the conductive portions 110 facing the insulation portion 120, may be subjected to anodizing. Then, the insulation portion 120 may be bonded to the anodized surface of each of the conductive portions 110. In other words, if the conductive portions 110 are made of aluminum, the respective bonding surfaces may be anodized prior to the bonding process in order to increase the bonding force. The anodized surfaces may be roughened as mentioned above.

In the present embodiment, if the conductive portions 110 are made of aluminum, the insulation portion 120 may be bonded by anodizing the surface of each of the conductive portions 110 facing the insulation portion 120.

In the present embodiment, a cavity 130 depressed inward of the conductive portions 110 is formed in the chip substrate 100 including the plating layer in order to form a space in which the chip is mounted. That is to say, referring to FIGS. 1 and 2, the surface of the chip substrate 100 on which the chip is mounted is formed in a shape depressed from the external surface. In other words, the chip substrate 100 has such a shape that the outer wall is formed around a region where the chip is mounted.

That is to say, in the present embodiment, the chip is mounted on the conductive portions 110 in the space defined within the cavity 130. After the chip is mounted, the cavity 130 is sealed by a lens or the like, thereby manufacturing a chip package.

Figure 3:
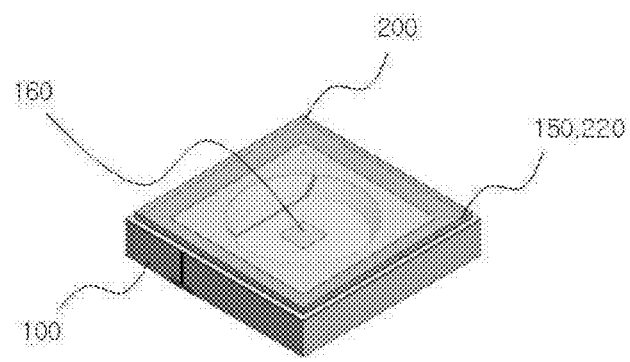
FIGS. 3 and 4 are views illustrating chip packages which make use of the chip substrate including the plating layer according to one embodiment of the present invention.
Figure 4:
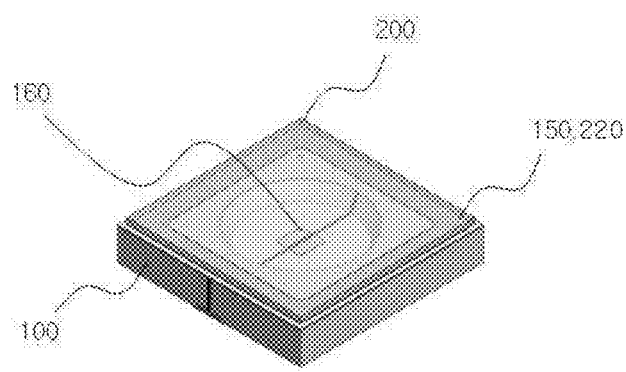

The chip substrate 100 according to the present embodiment further includes an insulation layer 140 made of an insulating material and coated on the upper surface of the chip substrate 100. In the present embodiment, a plating layer 150 is formed on the upper surface of the chip substrate 100 in order to realize a structure which seals the entirety of the chip substrate 100 including the cavity as shown in FIGS. 3 and 4 rather than a structure which seals only the space defined in the cavity. In this case, for the purpose of preventing the plating layer 150 and the insulation portion 120 from making contact with each other, the insulation layer 140 is formed by coating an insulating material on the upper surface of the chip substrate 100.

In the present embodiment, the insulating material may be polyimide (PI). Needless to say, different insulating materials may be selected depending on the necessity.

In FIG. 1, there is illustrated a case where the insulation layer 140 is formed on the entire upper surface of the chip substrate 100. However, depending on the intended use of the insulation layer 140, the insulation layer 140 may be formed only in a region where the insulation portion 120 is exposed on the upper surface of the chip substrate 100. The formation area of the insulation layer 140 may be differently set in view of the convenience in different processes.

In the present embodiment, the plating layer 150 is formed on the insulation layer 140 according to the aforementioned embodiment. That is to say, referring to FIG. 1, the plating layer 150 may be formed in a continuous band shape along the periphery of the chip substrate 100. As a material of the plating layer 150, it may be possible to use copper or different copper alloys such as Cu/Au, Cu/Ni/Au, or the like. The material of the plating layer 150 is not limited thereto and may be other materials to which a sealing member can be bonded.

In FIG. 1, there is illustrated an example where the plating layer 150 is formed in a rectangular shape along the upper surface of the rectangular chip substrate 100. However, the plating layer 150 may be formed in different shapes depending on the convenience in processes. Since the plating layer 150 is configured to realize a hermetic sealing structure through the bonding with a plating layer of a sealing member which will be described later, it is preferred that the plating layer 150 is formed as a non-broken continuous surface.

Figure 2:
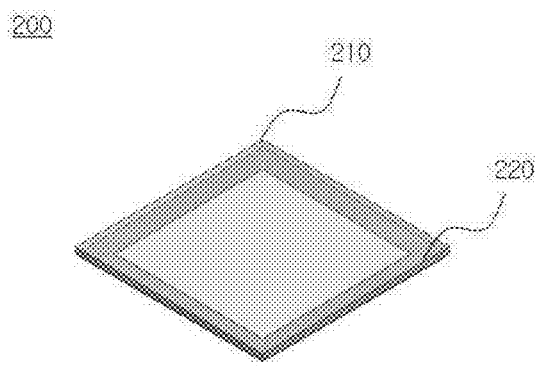
FIG. 2 is a view illustrating a sealing member of the chip substrate including the plating layer according to one embodiment of the present invention.

Since the plating layer 150 formed on the upper surface of the rectangular chip substrate 100 realizes a hermetic sealing structure through the bonding with the counterpart plating layer formed on one surface of the sealing member illustrated in FIG. 2, the plating layer 150 may be formed in many different patterns as long as the plating layer 150 can form a hermetic sealing structure through the bonding with the counterpart plating layer of the sealing member.

In the present embodiment, the chip substrate 100 may further include a bump 160. In the present embodiment, the bump 160 is formed at a predetermined height within the cavity 140 on the surface of one of the conductive portions isolated by the insulation portion. The bump 160 is bonded to the electrode portions formed in the chip.

In the present embodiment, the bump 160 is formed at a predetermined height on the surface of one of the conductive portions 110 isolated by the insulation portion 120 and is bonded to the electrode portions formed in the chip. That is to say, the bump 160 is formed on the surface of one of the conductive portions 110. Referring to FIG. 3, the bump 160 is formed on the surface of one of the conductive portions 110 near the insulation portion 120. Referring to FIG. 4, if the chip mounted on the bumps 160 has, e.g., a flip chip structure in which the electrode portions are positioned on the lower surface of the chip, the bump 160 may be formed at a predetermined height on the surfaces of the conductive portions 110 across the insulation portions existing within the cavity.

That is to say, the bump 160 is formed at a predetermined height on the surfaces of the conductive portions 110 isolated by the insulation portions 120. The bump 160 is preferably made of a conductive material so that the voltages applied to the conductive portions 110 can be applied to the electrode portions of the chip mounted on the bump 160. The bump 160 may be a gold bump made of gold.

In the present embodiment, if an optical element mounted as a chip has a flip chip structure in which the electrode portions are positioned at the lower end of the optical element, the electrode portions are formed on one surface of the chip facing the surfaces of the conductive portions 110 in which the cavity 130 is formed. The bump 160 is bonded to the electrode portions formed on one surface of the chip facing the bump 160 and may be applied with voltages.

FIGS. 3 and 4 are views illustrating a chip package in which the chip is mounted on the chip substrate 100 according to the embodiment described above. In FIG. 3, the electrode portions of the chip are formed on the bottom surface of the chip. If the chip is mounted on the chip substrate 100, the electrode portions of the chip make contact with the bump 160 formed in the chip substrate 100.

Accordingly, in the present embodiment, the bump 160 is formed in the region (electrode region) of the aluminum chip substrate 100 in which the chip is to be positioned. In another embodiment, the bump 160 may be previously formed in the electrode portions of a chip. Alternatively, the electrode portions of a chip may be formed at such a thickness that the electrode portions can serve as a bump. In this case, the chip may be directly bonded to the aluminum chip substrate 100.

Referring again to FIGS. 3 and 4, the chip substrate 100 may further include solders which are formed on the surface of the bump 160 in order to solder the electrode portions and the bump 160. The plating layer formed in the electrode region of a UV chip and the bump 160 may be bonded by a thermo-sonic bonding method. Alternatively, solders may be formed on the surface of the bump 160 so that the chip and the bump 160 can be bonded by soldering.

Furthermore, the chip substrate 100 according to the present embodiment may further include an electrode indication portion 170.

Referring again to FIG. 1, as described above, in the chip substrate 100 according to the present embodiment, the insulation portion 120 is interposed between two conductive portions 110. Thus, different voltages may be applied to the respective conductive portions 110 isolated by the insulation portion 120. Accordingly, if a mark is formed on the surface of one of the conductive portions 110 and if it is promised in advance that, for example, a positive voltage is applied to one of the conductive portions 110 having the mark, a user can easily determine the polarity of each of the conductive portions 110.

In the present embodiment, the chip substrate 100 including the plating layer may further include an insulation protection layer 180 coated on at least a portion of the lower surface or the side surface of the chip substrate 100 including the insulation portion 120.

More specifically, the chip substrate 100 illustrated in FIG. 1 is bonded to a printed circuit board and is supplied with electric power from the printed circuit board. In the bonding process of the printed circuit board and the chip substrate 100, a dielectric breakdown phenomenon of the insulation portion 120 exposed to the outside may occur.

In order to prevent the dielectric breakdown phenomenon, the chip substrate 100 according to the present embodiment may further include the insulation protection layer 180 which is formed on a portion of the lower surface or the side surface of the chip substrate 100, i.e., the surface bonded to the printed circuit board, so as to mask the insulation portion 120.

Hereinafter, the sealing member 200 of the chip substrate 100 including the plating layer according to the present embodiment will be described with reference to FIG. 2.

The sealing member 200 according to the present embodiment includes a sealing portion 210 and a counterpart plating layer 220.

The sealing portion 210 is disposed on the upper surface of the chip substrate 100 which includes the conductive portions 110 laminated in one direction and the insulation portions 120 alternately laminated with the conductive portions 110 to electrically isolate the conductive portions 110. The sealing portion 210 is configured to seal the cavity 130 formed at a predetermined depth in a recessed shape in the region including the insulation portions 120.

Referring to FIG. 2, the sealing portion 210 according to the present embodiment does not correspond in shape to the cavity 130 but has a structure which seals the entire upper surface of the chip substrate 100. Thus, the sealing portion 210 is preferably formed of a rectangular lens in a corresponding relationship with the shape of the upper surface of the chip substrate 100. In this case, the shape of the sealing portion 210 is determined depending on the shape of the upper surface of the chip substrate 100. Accordingly, the shape of the sealing portion 210 may vary with the shape of the chip substrate 100.

The counterpart plating layer 220 is formed on one surface of the sealing portion 210 in a corresponding relationship with the plating layer 150 continuously formed at a predetermined width along the periphery of the chip substrate 100 on the insulation layer 140 coated on the upper surface of the chip substrate 100 excluding the region of the cavity 130.

That is to say, referring to FIG. 2, the counterpart plating layer 220 may be formed at a predetermined thickness in a rectangular ring shape along the rectangular contour line of the sealing portion 210.

In this case, the thickness of the counterpart plating layer 220 may be determined depending on the position or the thickness of the plating layer 150 formed on the chip substrate 100.

That is to say, if the counterpart plating layer 220 and the plating layer 150 do not correspond to each other, it is impossible for the sealing member 200 to hermetically seal the chip substrate 100. Thus, the thickness of the counterpart plating layer 220 is set in view of the relative position of the counterpart plating layer 220 and the plating layer 150. Preferably the plating layer 150 is formed on the chip substrate 100 and the counterpart plating layer 220 is formed on one surface of the sealing portion 210 so that the counterpart plating layer 220 and the plating layer 150 face each other.

In the present embodiment, the counterpart plating layer 220 may be made of Au or Au—Sn alloy. The constituent material of the counterpart plating layer 220 is not particularly limited as long as the counterpart plating layer 220 can realize a hermetic sealing structure through the bonding with the plating layer 150 formed on the chip substrate 100.

A chip package including the plating layer according to one embodiment of the present invention will now be described with reference to FIG. 3 or FIG. 5.

The chip package according to the present embodiment includes a chip substrate 100, an optical element and a sealing member 200.

In the present embodiment, the chip substrate 100 includes conductive portions 110 laminated in one direction to constitute the chip substrate 100, insulation portions 120 alternately laminated with the conductive portions 110 to electrically isolate the conductive portions 110, a cavity 130 formed at a predetermined depth in a recessed shape in a region including the insulation portion 120, an insulation layer 140 coated on an upper surface of the chip substrate 100 excluding a region of the cavity 130, and a plating layer 150 continuously formed at a predetermined width along a periphery of the chip substrate 100 on the insulation layer 140.

The optical element is mounted within the cavity 130. The sealing member 200 includes a sealing portion 210 configured to seal the cavity 130 and a counterpart plating layer 220 formed on one surface of the sealing portion 210 in a corresponding relationship with the plating layer 150 of the chip substrate 100. The sealing member 200 is configured to seal the cavity 130 when the counterpart plating layer 220 is bonded to the plating layer 150 of the chip substrate 100.

The chip substrate 100, the optical element and the sealing member 200 have the configurations corresponding to those described in the aforementioned embodiment. Thus, duplicate descriptions thereon will be omitted.

According to the present invention, when sealing a cavity formed in a chip substrate, there is no need to mold and process a lens in a circular shape corresponding to the shape of the cavity. This makes it possible to seal the chip substrate with a lens having a simple shape such as a rectangular shape or the like. It is therefore possible to simplify a manufacturing process of a chip package.

The forgoing descriptions are mere illustration of the technical concept of the present invention. A person having an ordinary knowledge in the technical field to which the invention pertains will be able to make modifications, changes and substitutions without departing from the essential features of the invention.

Accordingly, the embodiments and the accompanying drawings disclosed herein are not intended to limit the technical concept of the present invention but are intended to describe the present invention. The technical concept of the present invention shall not be limited by the embodiments and the accompanying drawings. The protection scope of the present invention shall be construed on the basis of the appended claims. All the technical concepts which are equivalent in scope to the claims shall be construed to fall within the scope of the present invention.

What is claimed is:

1. A chip substrate, comprising:
    conductive portions laminated in one direction to constitute the chip substrate;
    insulation portions vertically penetrating the conductive portions to electrically isolate the conductive portions;
    a cavity formed at a predetermined depth in a recessed shape in a region including the insulation portions on an upper surface of the chip substrate;
    an insulation layer coated on an upper surface of the chip substrate excluding a region of the cavity; and
    a plating layer continuously formed at a predetermined width along a periphery of the chip substrate on the insulation layer,
    wherein a portion of a top surface of each insulation portion is exposed in the cavity, and another portion of the top surface of each insulation portion is coated with the insulation layer.

2. The chip substrate of claim 1, further comprising:
    a bump formed at a predetermined height within the cavity on a surface of at least one of the conductive portions isolated by the insulation portions.

3. The chip substrate of claim 2, further comprising:
    a bump formed at a predetermined height within the cavity on surfaces of the conductive portions across the insulation portions.

4. The chip substrate of claim 1, wherein the conductive portions or the insulation portions are formed in a plural number and the cavity is formed in a recessed shape in a region including at least two or more of the conductive portions and at least one or more of the insulation portions.

5. The chip substrate of claim 1, further comprising:
    an insulation protection layer coated on at least a portion of a lower surface or a side surface of the chip substrate including the insulation portions.

6. The chip substrate of claim 1, wherein the insulation portions are bonded to each of the conductive portions through an anodizing layer formed on at least one surface of each of the conductive portions and is configured to electrically isolate the conductive portions.

7. The chip substrate of claim 1, further comprising a chip substrate sealing member including:
    a sealing portion disposed on an upper surface of the chip substrate; and
    a counterpart plating layer formed on one surface of the sealing portion in a corresponding relationship with the plating layer.

8. The chip substrate claim 7, wherein the counterpart plating layer is formed on a surface of the sealing portion to be bonded to the chip substrate.

9. A chip package, comprising:
    a chip substrate which includes conductive portions laminated in one direction to constitute the chip substrate, insulation portions vertically penetrating the conductive portions to electrically isolate the conductive portions, a cavity formed at a predetermined depth in a recessed shape in a region including the insulation portions, an insulation layer coated on an upper surface of the chip substrate excluding a region of the cavity, and a plating layer continuously formed at a predetermined width along a periphery of the chip substrate on the insulation layer, wherein a portion of a top surface of each insulation portion is exposed in the cavity, and another portion of the top surface of each insulation portion is coated with the insulation layer;

an optical element mounted within the cavity; and a sealing member including a sealing portion configured to seal the cavity and a counterpart plating layer formed on one surface of the sealing portion in a corresponding relationship with the plating layer of the chip substrate, the sealing member configured to seal the cavity when the counterpart plating layer is bonded to the plating layer of the chip substrate.

* * * * *